United States Patent
Wu

(10) Patent No.: US 7,403,627 B2
(45) Date of Patent: Jul. 22, 2008

(54) AUDIO DOWNMIX APPARATUS WITH DYNAMIC-RANGE CONTROL AND METHOD FOR THE SAME

(75) Inventor: Gin-Der Wu, Taipei (TW)

(73) Assignee: Ali Corporation (TW)

(*) Notice: Subject to any disclaimer, the term of this patent is extended or adjusted under 35 U.S.C. 154(b) by 859 days.

(21) Appl. No.: 10/761,380

(22) Filed: Jan. 22, 2004

(65) Prior Publication Data
US 2005/0117759 A1 Jun. 2, 2005

(30) Foreign Application Priority Data
Nov. 18, 2003 (TW) ............... 92132284 A

(51) Int. Cl.
*H03G 7/00* (2006.01)
(52) U.S. Cl. ............... 381/106; 381/107; 381/119
(58) Field of Classification Search ............... 381/104, 381/106–107, 101–102, 61–63, 119
See application file for complete search history.

(56) References Cited

U.S. PATENT DOCUMENTS

| | | | | |
|---|---|---|---|---|
| 5,170,437 A | * | 12/1992 | Strahm | 381/106 |
| 5,396,562 A | * | 3/1995 | Ishimitsu et al. | 381/107 |
| 5,471,651 A | * | 11/1995 | Wilson | 455/72 |
| 6,556,661 B1 | * | 4/2003 | Ingalsbe et al. | 379/22.04 |
| 6,996,239 B2 | * | 2/2006 | Wood | 381/17 |
| 2003/0002686 A1 | * | 1/2003 | Millott et al. | 381/71.1 |
| 2004/0190734 A1 | * | 9/2004 | Kates | 381/106 |

* cited by examiner

*Primary Examiner*—Vivian Chin
*Assistant Examiner*—Disler Paul
(74) *Attorney, Agent, or Firm*—Birch, Stewart, Kolasch & Birch, LLP

(57) ABSTRACT

A method for audio downmix apparatus with dynamic-range control includes steps as follows. The procedure first calculates the power of a surround audio channel and a central audio channel and then estimates whether a gain of the surround audio channel and the central audio channel saturate or not. When the gain is saturated, the procedure enters a step for adjusting a gain of dynamic range control; while the gain is not saturated, the procedure enters a saturation process. After the step of adjusting a gain of dynamic range control, then processes a gain calculation; and then changes the gain and estimates whether the gain reaches a default value or not. When the gain reaches the default value, then the gain will be outputted. When the gain does not reach the default value, continues to process the gain calculation and change the gain.

10 Claims, 3 Drawing Sheets

AUDIO DOWNMIX APPARATUS WITH DYNAMIC-RANGE CONTROL AND METHOD FOR THE SAME

This Nonprovisional application claims priority under 35 U.S.C. §119(a) on Patent Application No(s). 92,132,284 filed in TAIWAN on Nov. 18, 2003, the entire contents of which are hereby incorporated by reference.

FIELD OF THE INVENTION

The present invention relates an audio downmix apparatus with dynamic-range control and method for the same. Specifically, the present invention provides a method for an audio signal processed by a digital media decompressor. The method solves the gain control problem for audio signal with downmix.

BACKGROUND OF THE INVENTION

As the progress of technology, we can play the movies at home by videotape, VCD or DVD. The performance of the movie is just as that in the movie theater.

In order to achieve the entertainment performance as in the movie theater, the image and the audio effect are the most important issues for a home movie system. The image must be large enough and delicate; the audio effect of the home movie system should mimic the sound-surrounding effect in a movie theater. Therefore, the recoding equipments and the high-tech audio stereos for sound-surrounding effect are quite important. The better of the recoding software and the audio stereos, the better the performance will be.

Therefore, two specifications of audio in the DVD player including Digital Theater Systems (DTS) and Dolby Digital are widespread. The Dolby Digital (AC-3) encoding specification is established by the Dolby Laboratories. The compression method of Dolby Digital involves a twelve-to-one destructive compression process. The audio file occupies a relatively small storage space and can be transmitted by a marginal bandwidth. The Dolby Digital technology will neglect over detail in audio data, which cannot be sensed by human's ear. This is contrary to the high fidelity principle, wherein the playback sound should be as genuine as recorded one.

The audio encoding technology of DTS, which is a multi-channel media system produced by the Digital Theater Systems Company, uses three-to-one destructive compression method. It has a better performance than that of DTS even thought it is sill a destructive compression method FIG. 1 shows an audio encoding mixer of a prior art including a delayed circuit unit 10, a level measuring unit 12, a curve control unit 14, a gain control unit 16 and an audio mixer 18. It can be seen that each technology mentioned above needs a complicated mathematical process for encoding. Therefore, a powerful CPU and a digital signal processor (DSP) and a very large physical memory should be used. That is too expensive for most of us.

SUMMARY OF THE INVENTION

It is an object of the present invention to provide an audio downmix apparatus with dynamic-range control and method for the same to solve the defects mentioned above. The present invention attenuates a gain of the audio source signal with a constant ratio, and then mixed with a sound. At the same time the channel source is rectified and produces an absolute value, then calculate a power gain value with the absolute value, and a gain adjustment unit will produce a final gain adjustment value by the power gain value.

The various objects and advantages of the present invention will be more readily understood from the following detailed description when read in conjunction with the appended drawing, in which:

DETAILED DESCRIPTION OF THE INVENTION

Figure 1:
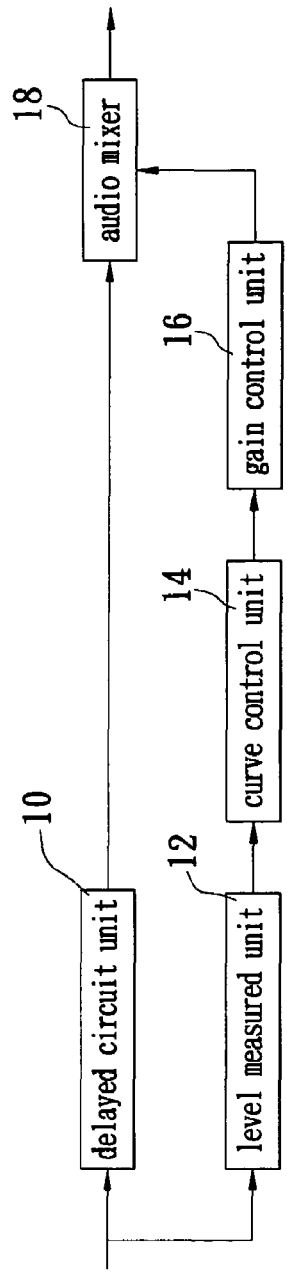
FIG. 1 shows a prior art of the audio encoding mix device.
Figure 2:
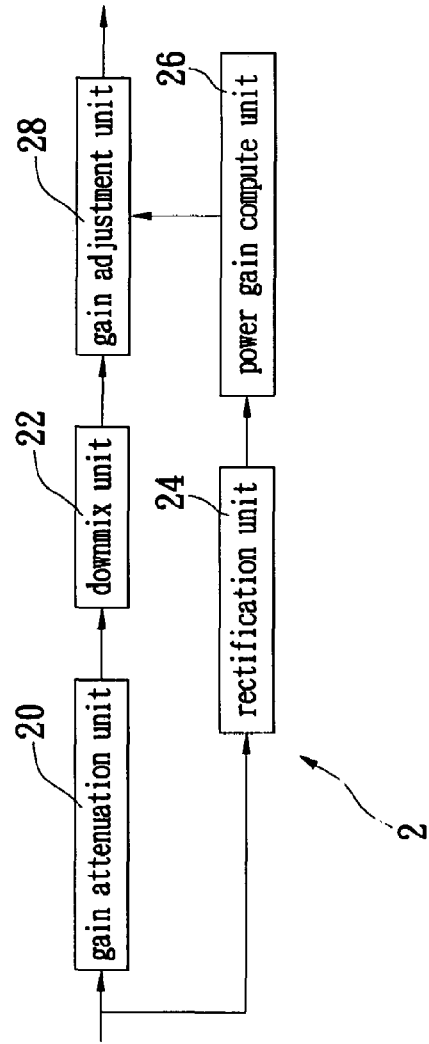
FIG. 2 shows a downmix output device of the present invention of the downmix method.

FIG. 2 shows the block diagram of an audio downmix apparatus with dynamic-range control according to a preferred embodiment of the present invention, which comprises a gain attenuation unit 20, a downmix unit 22, a rectification unit 24, a power gain computing unit 26 and a gain adjusting unit 28.

After an audio source signal is inputted to the audio downmix apparatus with dynamic-range control of the present invention, the gain attenuation unit 20 attenuates all the audio source signal with a predetermined ratio. The audio source signal after attenuation is transmitted into the downmix unit 22, and the audio source signal is also inputted into the rectification unit 24 at the same time. In the rectification unit 24, the audio source signal will be rectified with the negative parts of the audio source signal inversed and produces an absolute value. After rectified, the absolute value is inputted into the power gain compute unit 26 to calculate a gain value. The audio mixer apparatus of the present invention will transmit the gain value and a mixed audio signal produced by the downmix unit 22 to the gain adjustment unit 28. The gain adjustment unit 28 will adjust the gain of the output audio signal and transmit the output audio signal to a loudspeaker (not shown).

The device mentioned above can control the gain of the output audio signal with the mixed audio signal and simplify the circuit compared to the prior art. The audio downmix apparatus with dynamic-range control of the present invention will provide same effect for gain control with reduced price.

Figure 3:
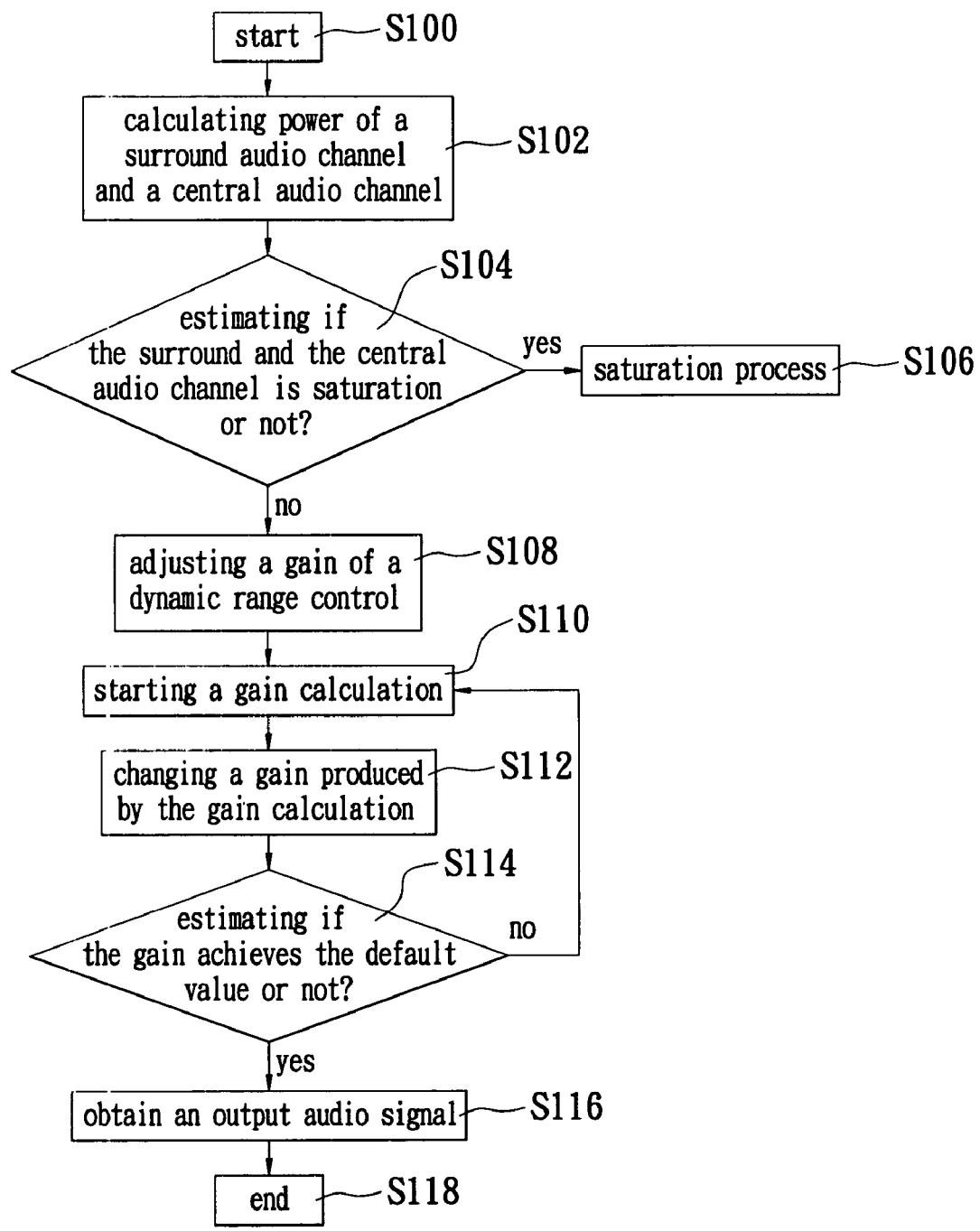
FIG. 3 shows a flowchart of the present invention of the downmix method.

FIG. 3 shows a flowchart of the present invention, and refer also to the FIG. 2. The method is a flow path of a program processed in the digital signal processor (DSP). In step S100, this procedure is started. In step S102, the power values of a surround audio channel and a central audio channel are calculated. Step S104 judges whether the surround audio channel and the central audio channel is saturated or not. If saturated a saturation process is is executed in a step S106; or a step 108 is executed. In step S108,the adjustment of a gain for dynamic range control (DRC) is controlled, step 108 is processed by the rectification unit 24 as in FIG. 2. Then in step S110, a gain calculation is performed. That is a process executed by the power gain compute unit 26. In step S112, a gain produced by the gain calculation is changed and in step S114 judges whether the gain achieves the default value or not, and the default value is between one and two. This procedure, step S114, is processed in the gain adjustment unit 28 in FIG. 2. In the procession of step S114 uses a Look-Up Table in the program to be the reference for doing the instant judgment.

When the gain is lower than the smallest default value, the gain value produced by the power gain compute unit 26 is set to be one. While the gain is between the smallest default value and the biggest default value, the gain value is smaller than one. While the gain is higher than the biggest default value, the gain value are two.

Figure 4A:
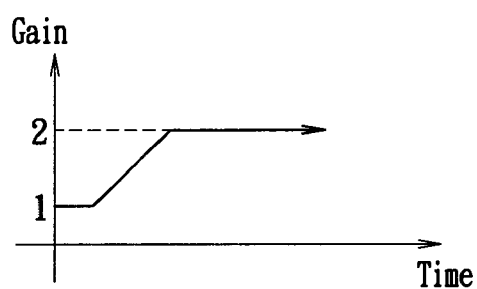
FIG. 4A shows a fade-in curve of the present invention.
Figure 4B:
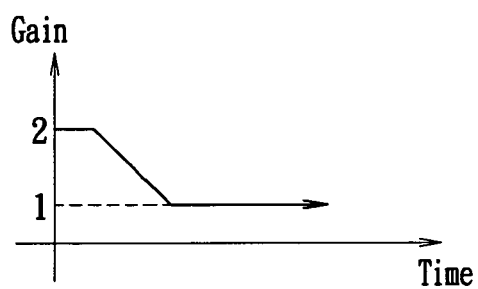
FIG. 4B show a fade-out curve of the present invention.

The increase and decrease of the gain is not in rapid manner. FIG. 4A and FIG. 4B show the ways for fade-in and fade-out the gain. Therefore, the gain value will not increase or decrease too fast in order to avoid audio spike situation.

In step 114, when the gain achieves the default value, then the procedure goes to step S116 and an outputs audio signal, while the step 110 will be preceded to calculate the gain again. Finally, the output audio signal with desired gain will be obtained and this program terminated in step S118.

The present invention as mentioned above can solve the problem of the gain control of the output audio signal with using no division calculation. Therefore, the present invention will not need to add additional memories or a very powerful CPU and DSP. So the present invention can achieve the same function of gain control with lower cost.

Although the present invention has been described with reference to the preferred embodiment therefore, it will be understood that the invention is not limited to the details thereof. Various substitutions and modification s have suggested in the foregoing description, and other will occur to those of ordinary skill in the art. Therefore, all such substitutions and modifications are intended to be embrace within the scope of the invention as defined in the appended claims.

What is claim is:

1. An audio mixing apparatus with dynamic-range control and used to transform an input signal to an output signal, comprising:
   a gain attenuation unit used to attenuate a first input signal with a predetermined ratio;
   a downmix unit used to mix an output signal of the gain attenuation unit;
   a rectification unit used to inversely rectify a second input signal and produces an absolute value for the second input signal;
   a power gain computing unit used to calculate the power gain of an output signal of the rectification unit; and
   a gain adjusting unit used to adjust an output audio signal of the gain adjustment unit by the absolute value of the downmix unit and an output of the power gain compute unit;
   whereby the first input signal is inputted into the gain attenuation unit and the downmix unit for producing an output signal to the gain adjustment unit; the second input signal is processed by the rectification unit and the power gain compute unit to produce a gain value, then the gain value is inputted the gain value to the gain adjustment unit; the gain adjusting unit adjusts and outputs an output gain based on the gain value.

2. The audio apparatus for downmix as in claim 1, wherein the rectification unit rectifies the input signal with inversing a plurality of negative parts of the input signal and produces an absolute value.

3. A method for audio downmix with dynamic-range control transforming, an audio input signal to an output signal, comprising steps as follows:
   calculating power values of a plurality of surround audio channels and a central audio channel;
   adjusting a gain of dynamic range control, the gain being obtained by rectifying the input signal with inversing a plurality of negative parts of the audio input signal and producing an absolute value;
   processing a calculation of the gain;
   changing the calculated gain and outputting an output gain;
   estimating whether the output gain reaches a default value or not; and
   obtaining a correct gain value based on the output gain.

4. The method for audio downmix with dynamic-range control as in claim 3, wherein the surround audio channels comprise a left surround audio channel and a right surround audio channel.

5. The method for downmix as in claim 3, further comprising a step for estimating saturation state of the surround audio channel in the calculating step.

6. The method for downmix as in claim 5, wherein the step of processing a calculation of the gain is to estimate whether the left surround audio channel, the right surround audio channel and the central surround audio channel are saturated or not; when saturated, a saturation procedure is executed.

7. The method for downmix as in claim 3, wherein in the estimating step, when the output gain reaches the default value, then process the obtaining step as in claim 3.

8. The method for downmix as in claim 3, wherein the default value is between one and two.

9. The method for downmix as in claim 3, wherein the gain is changed in a fade-in or fade-out manner in the changing step.

10. The method for downmix as in claim 3, wherein in the estimating step, when the output gain fails to reach the default value, then process the changing the calculated gain step as in claim 3.

* * * * *